(12) United States Patent  
Kato

(10) Patent No.: US 7,419,904 B2
(45) Date of Patent: Sep. 2, 2008

(54) METHOD FOR FORMING BARRIER FILM AND METHOD FOR FORMING ELECTRODE FILM

(75) Inventor: Nobuyuki Kato, Shizuoka (JP)

(73) Assignee: Ulvac Inc., Chigasaki-shi (JP)

( * ) Notice: Subject to any disclaimer, the term of this patent is extended or adjusted under 35 U.S.C. 154(b) by 0 days.

(21) Appl. No.: 11/495,648

(22) Filed: Jul. 31, 2006

(65) Prior Publication Data

US 2006/0264038 A1 Nov. 23, 2006

Related U.S. Application Data

(63) Continuation of application No. PCT/JP2005/006854, filed on Apr. 7, 2005.

(30) Foreign Application Priority Data

Apr. 12, 2004 (JP) ............................. 2004-116379

(51) Int. Cl.
*H01L 21/4763* (2006.01)

(52) U.S. Cl. .......... 438/627; 257/E21.17; 257/E21.584; 438/680; 438/685

(58) Field of Classification Search ............ 257/E21.17, 257/E21.584; 438/627, 685
See application file for complete search history.

(56) References Cited

U.S. PATENT DOCUMENTS 6,861,356 B2 * 3/2005 Matsuse et al. ............. 438/653

7,005,372 B2 * 2/2006 Levy et al. .................. 438/627
7,211,508 B2 * 5/2007 Chung et al. ............... 438/633
2004/0238876 A1 * 12/2004 Youn et al. .................. 257/315

FOREIGN PATENT DOCUMENTS

| JP | 6-89873 | 3/1994 |
|---|---|---|
| JP | 7-252660 | 10/1995 |
| JP | 8-45878 | 2/1996 |
| JP | 11-54459 | 2/1999 |
| JP | 11-102909 | 4/1999 |
| JP | 2000-212749 | 8/2000 |
| JP | 2001-23930 | 1/2001 |
| JP | 2001-254181 | 9/2001 |
| JP | 2001-319930 | 11/2001 |
| JP | 2002-60944 | 2/2002 |
| JP | 3415207 | 6/2003 |

* cited by examiner

*Primary Examiner*—Asok K Sarkar
(74) *Attorney, Agent, or Firm*—Kratz, Quintos & Hanson, LLP

(57) ABSTRACT

In the present invention, a barrier film 20 is formed by forming a tungsten nitride film 21 and subsequently by forming a tungsten silicide film 22. The tungsten silicide film 22 is exposed at the surface of the barrier film 20, and an electrode film 25' is formed so as to be brought into close contact with the tungsten silicide film 22. Since a conductive material constituting the electrode film 25' is chemically bound to silicon atoms in the tungsten silicide film 22, the adhesion between the barrier film 20 and the electrode film 25' is high, and the electrode film 25' resists peeling from the barrier film 20. Further, agglomeration is not likely to occur in the electrode film 25' during annealing.

12 Claims, 16 Drawing Sheets

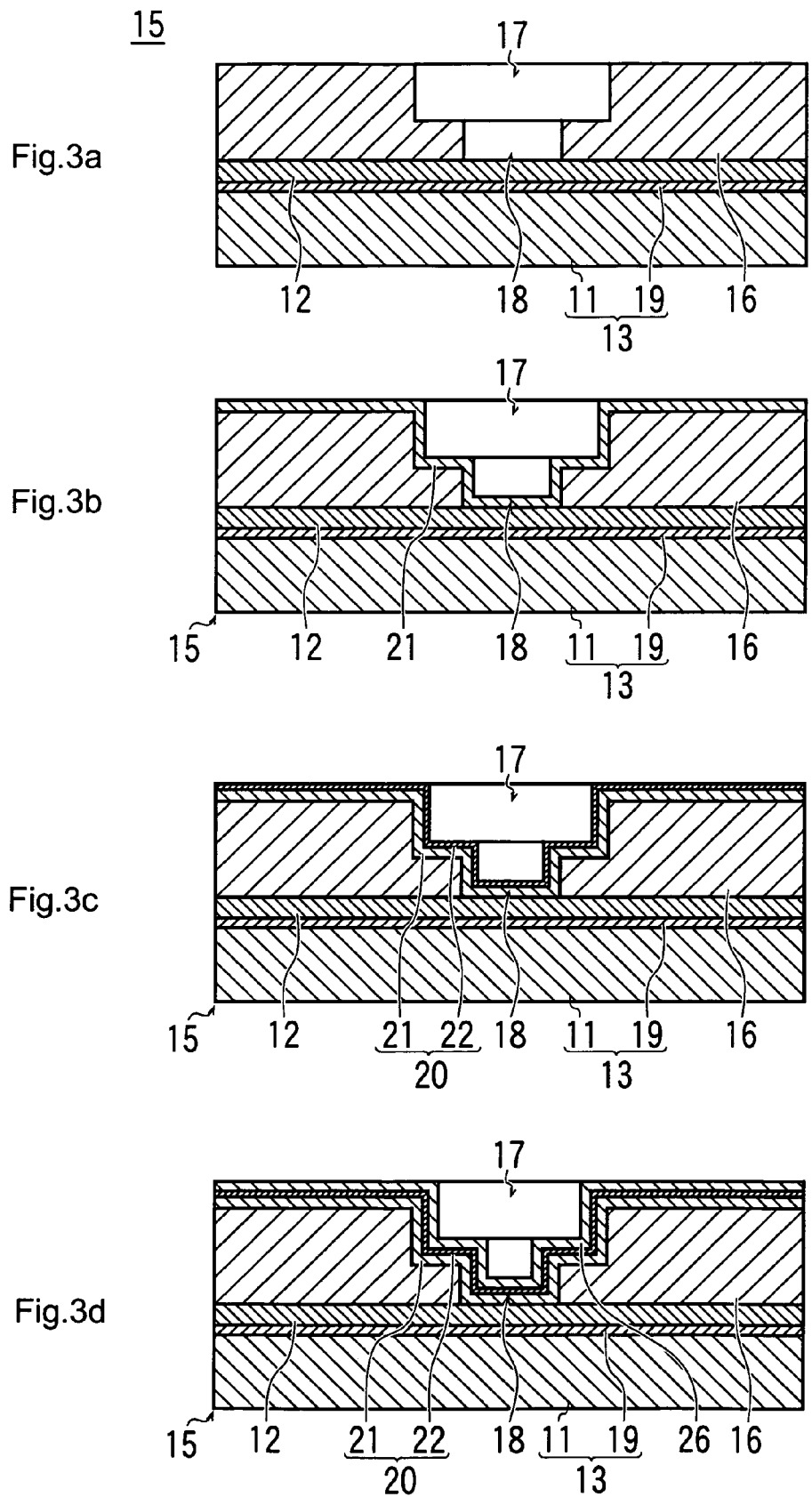

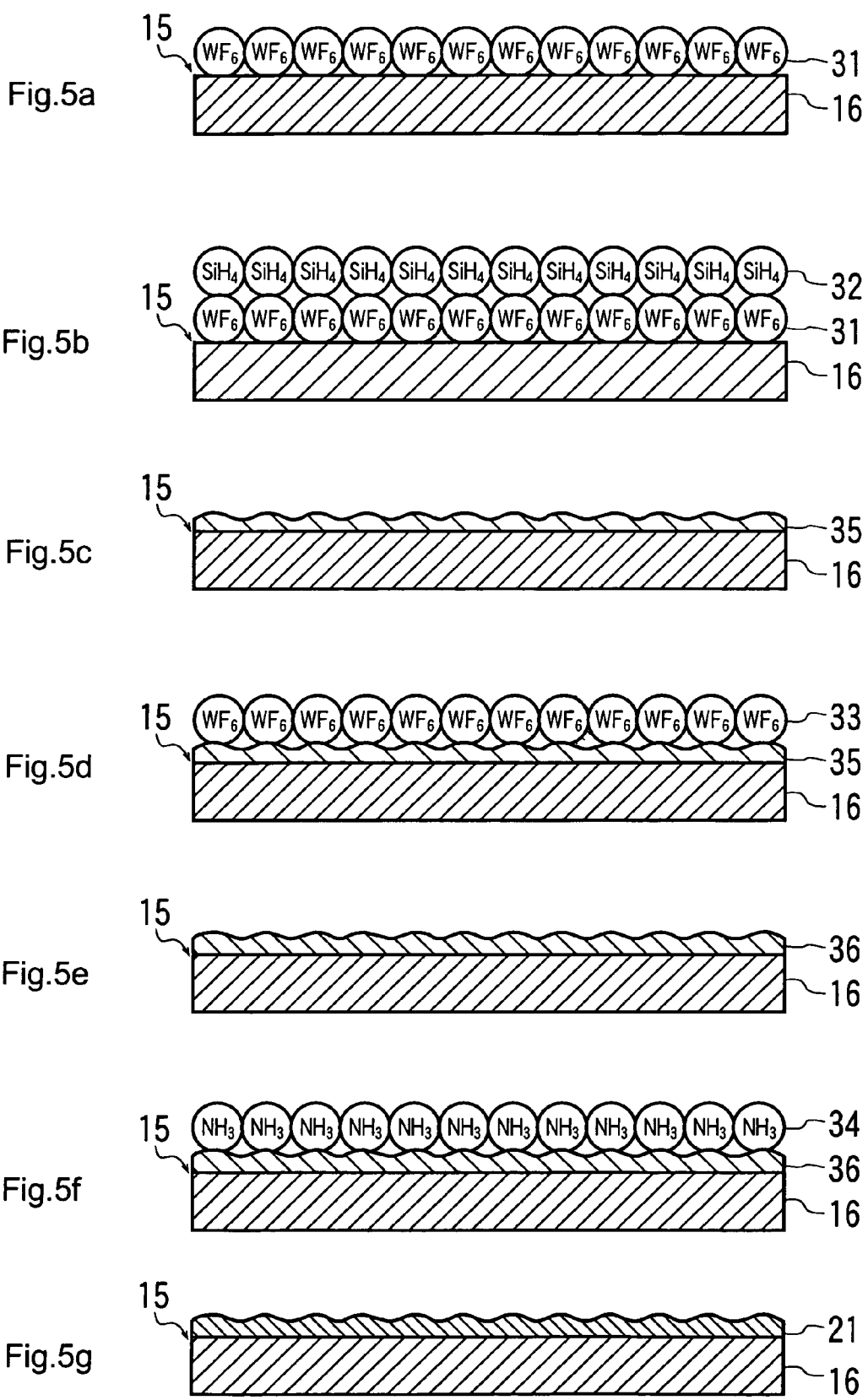

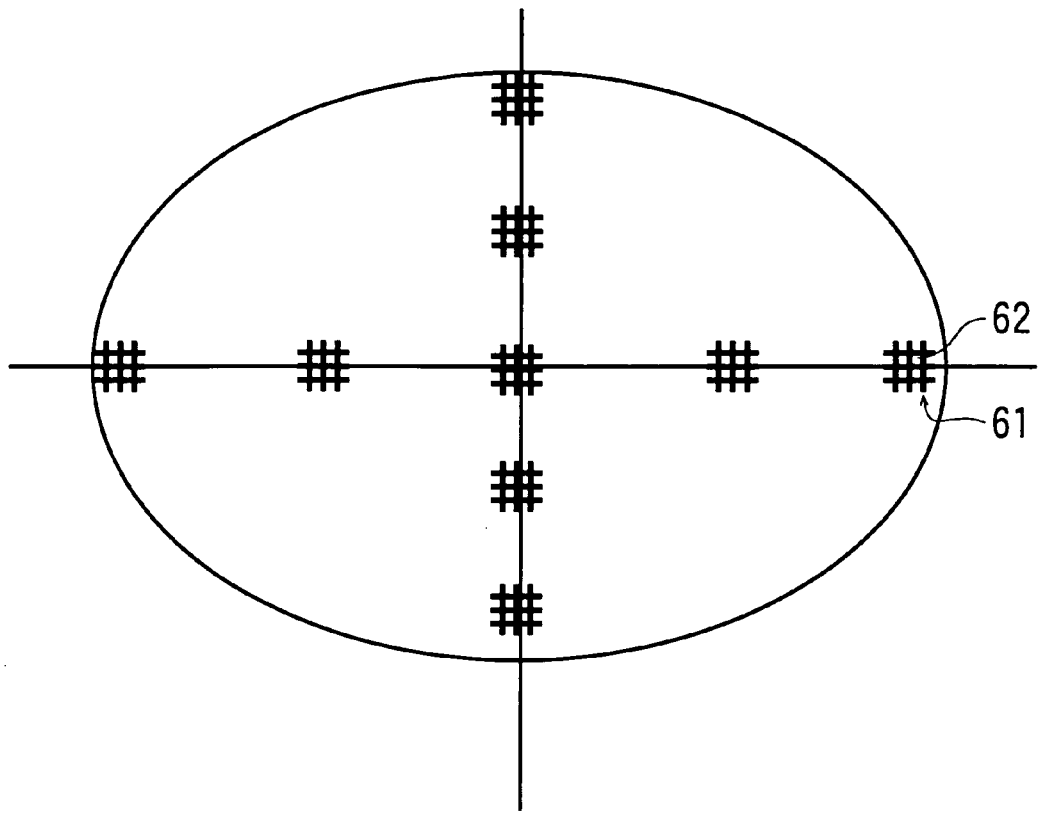
Fig.11
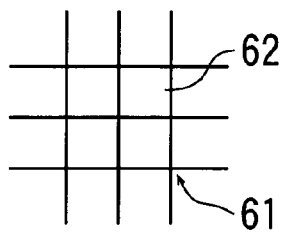 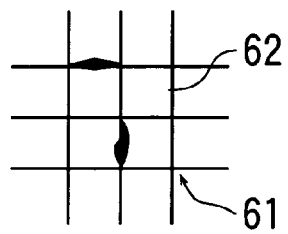 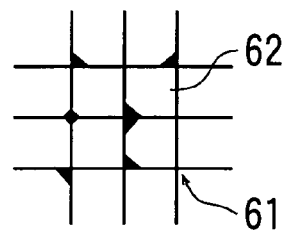
Fig.12a    Fig.12b    Fig.12c
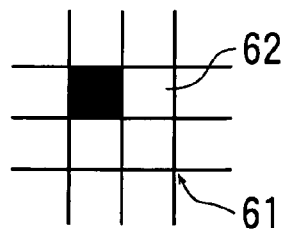 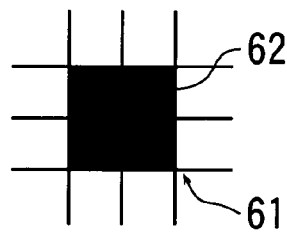
Fig.12d    Fig.12e

METHOD FOR FORMING BARRIER FILM AND METHOD FOR FORMING ELECTRODE FILM

CROSS-REFERENCE TO RELATED APPLICATIONS

This application claims priority benefit of Japanese Application No. 2004-116379, filed on Apr. 12, 2004, the entire disclosure of which is incorporated herein by reference.

This application is a continuation of International Application No. PCT/JP2005/006854, filed on Apr. 7, 2005, the entire disclosure of which is incorporated herein by reference.

BACKGROUND OF THE INVENTION

1. Field of the Invention

The present invention generally relates to a method for forming a film, and more particularly to a method for forming a barrier film of a semiconductor device.

2. Description of the Related Art

Conventionally, as a method for forming an electrode film and plugs on a device having a dual damascene structure, there has been a method in which the electrode film is obtained by forming a barrier film on the device surface, forming a conductive film on the barrier film surface to fill trenches on the device with the conductive film, and subsequently polishing the conductive film by means of a CMP (Chemical Mechanical Polishing) method to separate the conductive film remaining in the trenches.

As a material for composing the barrier film, tungsten nitride or tantalum nitride has been used. A conductive material which composes the conductive film for Cu wiring is not chemically bound to the material composing the barrier film. Thus, since the adhesion between the barrier film and the conductive film (particularly Cu) is poor, peeling occasionally occurs at the boundary between the conductive film and the barrier film during the CMP step after the formation of the conductive film, causing peeling off the conductive film from the device.

Patent document 1: Japanese Patent Laid-Open Publication No. 2001-23930.

Patent document 2: Japanese Patent Laid-Open Publication No. Hei 11(1999)-54459.

Patent document 3: Japanese Patent No. 3415207.

Patent document 4: Japanese Patent Laid-Open Publication No. Hei 6(1994)-89873.

Patent document 5: Japanese Patent Laid-Open Publication No. 2000-212749.

Patent document 6: Japanese Patent Laid-Open Publication No. 2001-319930.

Patent document 7: Japanese Patent Laid-Open Publication No. Hei 7(1995)-252660.

SUMMARY OF THE INVENTION

The present invention has been made in order to solve the disadvantages of the above conventional technology, and it is an object of the present invention to form a barrier film having a high adhesion to an electrode film.

In order to solve the above problems, the present invention is a method for forming a barrier film by placing an object to be processed in a vacuum atmosphere and forming a barrier film on the surface of the object to be processed, the method comprising: a tungsten nitride film forming step of forming a tungsten nitride film on the surface of the object to be processed; and a tungsten silicide film forming step of forming a tungsten silicide film on the surface of the tungsten nitride film, wherein the tungsten silicide film forming step comprises: a tungsten supplying step of supplying a tungsten-containing gas containing a gas of a tungsten compound to the vacuum atmosphere and subsequently evacuating the tungsten-containing gas from the vacuum atmosphere; and a silicon supplying step of supplying a silicon-containing gas containing a gas of a silicon compound to the vacuum atmosphere and subsequently evacuating the silicon-containing gas from the vacuum atmosphere.

The present invention also provides a barrier film forming method, wherein the tungsten supplying step and the silicon supplying step are alternately performed in the tungsten silicide film forming step.

The present invention also provides a barrier film forming method, wherein the tungsten nitride film forming step comprises: a first material gas supplying step of supplying a first material gas containing a gas of a tungsten compound to the vacuum atmosphere and subsequently evacuating the first material gas from the vacuum atmosphere; a reducing step of supplying to the vacuum atmosphere a reducing gas which reduces the tungsten compound and subsequently evacuating the reducing gas from the vacuum atmosphere; a second material gas supplying step of supplying a second material gas containing a gas of a tungsten compound to the vacuum atmosphere and subsequently evacuating the second material gas from the vacuum atmosphere; and a nitriding step of supplying to the vacuum atmosphere a nitriding gas which contains nitrogen in its chemical structure and which reacts with tungsten to generate tungsten nitride and subsequently evacuating the nitriding gas from the vacuum atmosphere.

The present invention further provides a barrier film forming method comprising: a reduction product deposition step of depositing a reduction product of a tungsten compound by continuously performing the first material gas supplying step and the reducing step, wherein either one of the first material gas step and the reducing step is performed first and the other step is performed thereafter; and a tungsten nitride deposition step of depositing tungsten nitride by continuously performing the second material gas supplying step and the nitriding step, wherein either one of the second material gas supplying step and the nitriding step is performed first and the other step is performed thereafter, the reduction product deposition step and the tungsten nitride deposition step being alternately repeated.

The present invention also provides a barrier film forming method, wherein the tungsten nitride film forming step and the tungsten silicide film forming step are performed in the same vacuum chamber.

In a method for forming an electrode film by placing an object to be processed in a vacuum atmosphere, forming a barrier film on the surface of the object to be processed, and subsequently forming an electrode film on the surface of the barrier film, a step of forming the barrier film comprises: a tungsten nitride film forming step of forming a tungsten nitride film on the surface of the object to be processed; and a tungsten silicide film forming step of forming a tungsten silicide film on the surface of the tungsten nitride film, wherein the tungsten silicide film forming step comprises: a tungsten supplying step of supplying a tungsten-containing gas containing a gas of a tungsten compound to the vacuum atmosphere and subsequently evacuating the tungsten-containing gas from the vacuum atmosphere; and a silicon supplying step of supplying a silicon-containing gas containing a gas of a silicon compound to the vacuum atmosphere and subsequently evacuating the silicon-containing gas from the vacuum atmosphere, and wherein a step of forming the electrode film places a conductive layer containing copper as a primary component on the surface of the barrier film.

The present invention also provides a method of forming an electrode film, wherein a conductive material containing copper as a primary component is sputtered to place the conductive layer containing copper as a primary component on the surface of the barrier film.

A tungsten silicide film containing silicon atoms has higher adhesion with a conductive material constituting an electrode film than other barrier film materials, such as tungsten nitride and tungsten itself. Thus, the electrode film resists peeling off from the barrier film.

BRIEF DESCRIPTION OF THE DRAWINGS

FIGS. 3a to 3d are cross-sectional views for illustrating the first half of the steps of forming the electrode film.

FIGS. 5a to 5g are enlarged cross-sectional views for illustrating the steps of forming a tungsten nitride film.

FIG. 11 is a plan view for illustrating a scratched portion and an evaluation area provided in a peel test.

FIGS. 12a to 12e are views for illustrating evaluation points of the peel test.

Figure 1:
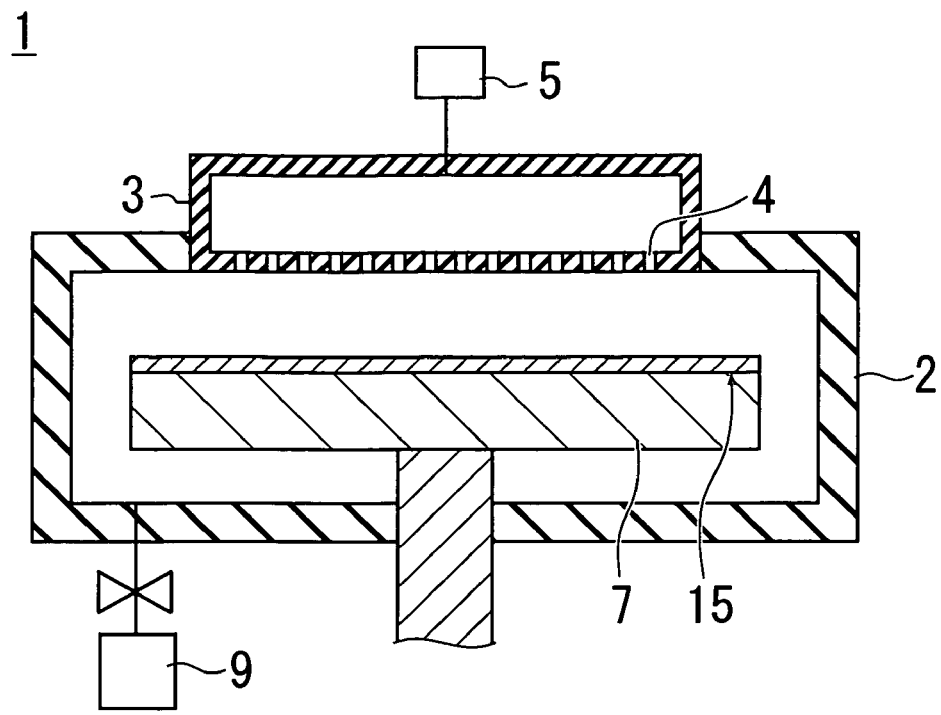
FIG. 1 is a cross-sectional view showing an example of a film forming apparatus used for forming a barrier film.

In the figures, the reference numerals correspond to the respective elements as follows; 1: film forming apparatus, 2: vacuum chamber, 5: gas supply system, 11: semiconductor substrate, 12: first electrode film, 13: processing substrate, 15: object to be processed, 16: insulating film, 17: trench, 18: hole, 19: insulative thin film, 20: barrier film, 21: tungsten nitride film, 22: tungsten silicide film, 25': second electrode film, 50: sputtering apparatus.

DETAILED DESCRIPTION OF PREFERRED EMBODIMENTS

The numeral 15 in FIG. 3a designates an object to be processed used in the present invention, and the object 15 to be processed comprises a processing substrate 13. The processing substrate 13 comprises a silicon substrate serving as a semiconductor substrate 11, and a silicon oxide film serving as an insulative thin film 19 is formed on the surface of the semiconductor substrate 11.

A plurality of first electrode films 12 patterned in elongated shapes are arranged on the surface of the processing substrate 13 of the side on which surface the insulative thin film 19 is formed. An insulating film 16 is formed on the surface of the processing substrate 13 of the side on which surface the first electrode films 12 are arranged. A plurality of trenches 17 having a depth smaller than the film thickness of the insulating film 16 are formed on the surface of the insulating film 16; and the insulating film 16 is exposed at the bottom of each of the trenches 17.

Each of the trenches 17 has an elongated shape and is positioned so as to intersect with the first electrode films 12. A hole 18 is formed in a predetermined region in the bottom surface of the trench 17 which region is located within each of the regions where the trench 17 intersects with the first electrode film 12; and the surface of the first electrode film 12 is exposed at the bottom of the hole 18.

In order to form a barrier film and an electrode film on the object 15 to be processed, the object 15 to be processed is first transported inside a processing apparatus (not shown), and a vacuum atmosphere is formed inside the processing apparatus. Subsequently, a cleaning gas is supplied into the processing apparatus to generate plasma of the cleaning gas. Then, organic materials adhering to the object 15 to be processed are decomposed and removed by the plasma. Thus, a clean surface of the first electrode film 12 is exposed at the bottom of the hole 18 (a pretreatment step).

The numeral 1 in FIG. 1 designates a film forming apparatus, and the film forming apparatus 1 comprises a vacuum chamber 2. A vacuum evacuation system 9 is connected to the vacuum chamber 2. The vacuum evacuation system 9 is activated, and then a vacuum atmosphere having a predetermined pressure is formed inside the vacuum chamber 2.

A substrate holder 7 is placed inside the vacuum chamber 2. While the vacuum evacuation is continued to maintain the vacuum atmosphere, the object 15 to be processed which has been subjected to the pretreatment step is loaded in the vacuum chamber 2 and held by the substrate holder 7 to place the object 15 to be processed in the vacuum atmosphere.

The substrate holder 7 has heating means (not shown), and the substrate holder 7 has been preheated by the heating means. Thus, when the object 15 to be processed is held by the substrate holder 7, the temperature of the object 15 to be processed is increased due to heat conduction. A shower head 3 is mounted to the wall surface of the vacuum chamber 2 which wall surface is opposed to the object 15 to be processed. A gas supply system 5 is arranged outside the vacuum chamber 2, and the shower head 3 is connected to the gas supply system 5.

A plurality of orifices 4 are provided in the surface of the shower head 3 which surface is opposed to the object 15 to be processed. When the temperature of the object 15 to be processed is increased to a predetermined film forming temperature, the temperature is maintained at the predetermined film forming temperature. A first material gas comprising a tungsten compound gas is then supplied to the shower head 3 from the gas supply system 5; and the first material gas supplied to the inside of the shower head 3 is ejected from each of the orifices 4 to the inside of the vacuum chamber 2.

The object 15 to be processed is held by the substrate holder 7 with the surface on which the insulating film 16 is formed directed to the shower head 3; and the first material gas is sprayed from each of the orifices 4 on the surface of the object 15 to be processed of the side on which surface the insulating film 16 is formed.

While the first material gas is supplied and the vacuum evacuation is continued, the tungsten compound molecules constituting the first material gas are adsorbed on surfaces exposed at the surface of the object 15 to be processed of the side on which surface the insulating film 16 is placed; i.e., the surface of the insulating film 16, the inner walls of the trenches 17, the inner walls of the holes 18, and the surfaces of the first electrode films 12 which surface is exposed at the bottom of the hole 18. Accordingly, the molecular layer of the first material gas is formed.

The first material gas is supplied for a predetermined time; and subsequently, the supply of the first material gas is stopped with the object 15 to be processed maintained at the film forming temperature while the vacuum evacuation is continued. Then, the first material gas is evacuated, and the pressure inside the vacuum chamber 2 is lowered (a first material gas supplying step).

While the first material gas is evacuated from the inside of the vacuum chamber 2, some of the tungsten compound molecules are desorbed from the molecular layer of the first material gas. However, the rest of the molecules remain in the adsorbed state on the object 15 to be processed to thereby maintain the molecular layer.

FIG. 5a is an enlarged cross-sectional view showing the surface (in this case, the surface of the insulating film 16) of the object 15 to be processed on which the insulating film 16 is placed just after the first material gas supplying step, and the numeral 31 in the figure designates the molecular layer of the first material gas.

In this case, the tungsten compound gas constituting the first material gas is $WF_6$ gas (tungsten hexafluoride), and the molecular layer 31 of the first material gas consists of a monomolecular layer of the tungsten compound molecule or a multimolecular layer formed by stacking two or more tungsten compound molecules.

Next, while continuing the vacuum evacuation with the object 15 to be processed maintained at the film forming temperature, a reducing gas comprising a reducing compound gas is supplied to the inside of the vacuum chamber 2 from the gas supply system 5 to increase the pressure of the vacuum atmosphere in which the object 15 to be processed has been placed. The molecules of the reducing compound constituting the reducing gas are adsorbed on the surface of the molecular layer 31 of the first material gas, and a molecular layer of the reducing gas is formed.

The reducing gas is supplied for a predetermined time; and subsequently, the supply of the reducing gas is stopped with the object 15 to be processed maintained at the film forming temperature while the vacuum evacuation is continued. Then, the reducing gas is evacuated, and the pressure inside the vacuum chamber 2 is lowered.

While the reducing gas is evacuated from the inside of the vacuum chamber 2, some of the reducing compound molecules are desorbed from the molecular layer of the reducing gas. However, the rest of the molecules remain in the adsorbed state on the surface of the molecular layer 31 of the first material gas to thereby maintain the molecular layer.

The numeral 32 in FIG. 5b designates the molecular layer of the reducing gas maintained on the surface of the molecular layer 31 of the first material gas, and the molecular layer 32 consists of a monomolecular layer of the reducing compound molecule or a multimolecular layer formed by stacking two or more reducing compound molecules.

In this case, the reducing compound constituting the reducing gas is mono-silane ($SiH_4$). In a state in which the molecular layer 32 of the reducing gas is formed, the object 15 to be processed is maintained at the film forming temperature. A reduction reaction then proceeds in which the tungsten compound molecules in the molecular layer 31 of the first material gas are reduced by reacting with the reducing compound molecules in the molecular layer 32 of the reducing gas. Thus, tungsten silicide ($WSi_x$: x is an arbitrary integer), as the reduction product of the tungsten compound, is deposited to thereby form a reduction product film 35 as shown in FIG. 5c (a reducing step).

Next, while continuing the vacuum evacuation, a second material gas comprising a tungsten compound gas is supplied from the gas supply system 5 to increase the pressure inside the vacuum chamber 2. Thus, the molecules of the tungsten compound constituting the second material gas are adsorbed on the surface of the reduction product film 35, and a molecular layer of the second material gas is formed.

The second material gas is supplied for a predetermined time; and subsequently, the supply of the second material gas is stopped with the object 15 to be processed maintained at the film forming temperature while the vacuum evacuation is continued. Then, the second material gas is evacuated so that the pressure inside the vacuum chamber 2 is lowered.

While the second material gas is evacuated, some of the tungsten compound molecules are desorbed from the molecular layer of the second material gas. However, the rest of the molecules remain in the adsorbed state on the reduction product film 35 to thereby maintain the molecular layer.

The numeral 33 in FIG. 5d designates the molecular layer of the second material gas remaining on the surface of the reduction product film 35. The molecular layer 33 consists of a monomolecular layer of the tungsten compound molecule (in this case, $WF_6$) or a multimolecular layer formed by stacking two or more tungsten compound molecules.

In the above state, the object 15 to be processed is maintained at the film forming temperature. Then, the tungsten compound constituting the molecular layer 33 of the second material gas is reacted with tungsten silicide constituting the reduction product film 35. Thus, silicon in the tungsten silicide is bound to fluorine in the tungsten compound to form silane fluoride, and the silane fluoride is desorbed from the reduction product film 35 to the inside of the vacuum chamber 2 and is evacuated. At the same time, tungsten in the tungsten silicide and tungsten in the tungsten compound are deposited on the surface of the object 15 to be processed to thereby form a tungsten atomic layer 36 as shown in FIG. 5e (a second material gas supplying step).

Next, while continuing the vacuum evacuation with the object 15 to be processed maintained at the film forming temperature, a gas of a nitride compound (a nitriding gas) for nitriding the tungsten is supplied to the inside of the vacuum chamber 2 from the gas supply system 5 to increase the pressure inside the vacuum chamber 2. Thus, the molecules of the nitride compound are adsorbed on the surface of the atomic layer 36, and a molecular layer of the nitriding gas is formed.

The nitriding gas is supplied for a predetermined time, and subsequently the supply of the nitriding gas is stopped with the object 15 to be processed maintained at the film forming temperature while the vacuum evacuation is continued. Then, the nitriding gas is evacuated, and the pressure inside the vacuum chamber 2 is lowered.

While the nitriding gas is evacuated, some of the nitride compound molecules are desorbed from the molecular layer of the nitriding gas. However, the rest of the molecules remain in the adsorbed state on the atomic layer 36 to thereby maintain the molecular layer.

The numeral 34 in FIG. 5f designates the molecular layer of the nitride compound molecule remaining on the surface of the atomic layer 36. The molecular layer 34 consists of a monomolecular layer of the nitride compound molecule (in this case, $NH_3$) or a multimolecular layer formed by stacking two or more nitride compound molecules.

In a state in which the molecular layer 34 of the nitride compound molecule is formed, the object 15 to be processed is maintained at the film forming temperature. Then, the tungsten atoms in the atomic layer 36 are nitrided by the nitride compound, and a tungsten nitride film 21 is formed as shown in FIG. 5g.

The nitriding gas is supplied for a predetermined time; and subsequently, the supply of the nitriding gas is stopped while the vacuum evacuation is continued. Then, the nitriding gas is evacuated, and the pressure inside the vacuum chamber 2 is lowered (a nitriding step).

The first material gas supplying step and the reducing step constitute a reduction product deposition step, and the second material gas supplying step and the nitriding step constitute a tungsten nitride deposition step. When the reduction product deposition step and the tungsten nitride deposition step are alternately repeated, the tungsten nitride film grows to form the tungsten nitride film 21 having a large film thickness.

FIG. 3b shows a state after the reduction product deposition step and the tungsten nitride deposition step are repeated such that the tungsten nitride film 21 has a predetermined film thickness. As described above, the tungsten compound molecules in the first material gas are adsorbed on the surface of the insulating film 16, the inner walls of the trenches 17, the inner walls of the holes 18, and the surface of the first electrode films 12 which surface is exposed at the bottom of the hole 18. Thus, the following reactions occur on each of the above surfaces: the reaction in which the tungsten compound molecules are reacted with the reducing compound to form the reduction product; the reaction in which the reduction product is reacted with the tungsten compound in the second material gas to deposit tungsten atoms; and the reaction in which the tungsten atoms are reacted with the nitride compound to form tungsten nitride. Therefore, the tungsten nitride film 21 is formed continuously over the surface of the insulating film 16, the inner walls of the trenches 17, the inner walls of the holes 18, and the surface of the first electrode films 12 which surface is exposed at the bottom of the hole 18.

In a state in which the tungsten nitride film 21 is formed, the vacuum evacuation is continued. When the first and second material gases, the reducing gas, and the nitriding gas are evacuated from the inside of the vacuum chamber 2, a tungsten-containing gas comprising a tungsten compound is supplied from the gas supply system 5 while continuing the vacuum evacuation. Thus, the pressure inside the vacuum chamber 2 is increased, and the molecules of the tungsten compound are adsorbed on the surface of the tungsten nitride film 21, and a molecular layer of the tungsten-containing gas is formed.

The tungsten-containing gas is supplied for a predetermined time, and subsequently the supply of the tungsten-containing gas is stopped while the vacuum evacuation is continued. Then, the tungsten-containing gas is evacuated, and the pressure inside the vacuum chamber 2 is lowered.

At this time, some of the tungsten compound molecules are desorbed from the molecular layer of the tungsten-containing gas. However, as in the above described first material gas supplying step, the rest of the molecules remain in the adsorbed state on the tungsten nitride film 21 to thereby maintain the molecular layer (a tungsten supplying step).

Figure 6A:
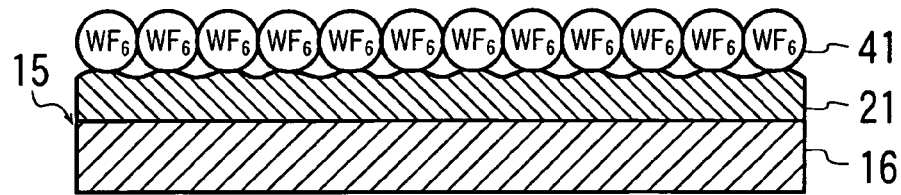
FIGS. 6a to 6c are enlarged cross-sectional views for illustrating the steps of forming a tungsten silicide film.

The numeral 41 in FIG. 6a designates the molecular layer of the tungsten-containing gas remaining on the surface of the tungsten nitride film 21. In this case, the tungsten-containing gas consists of the same gas as the first and second material gases ($WF_6$ gas) and the molecular layer 41 of the tungsten-containing gas consists of a monomolecular layer of the tungsten compound molecule or a multimolecular layer formed by stacking two or more tungsten compound molecules.

Next, while continuing the vacuum evacuation, a silicon-containing gas comprising a silicon compound gas is supplied to increase the pressure inside the vacuum chamber 2. Then, the silicon compound molecules in the silicon-containing gas are adsorbed on the surface of the molecular layer 41 of the tungsten-containing gas, and a molecular layer of the silicon-containing gas is formed.

The silicon-containing gas is supplied for a predetermined time; and subsequently, the supply of the silicon-containing gas is stopped while the vacuum evacuation is continued Then, the silicon-containing gas is evacuated, and the pressure inside the vacuum chamber 2 is lowered. At this time, some of the silicon compound molecules are desorbed from the molecular layer of the silicon-containing gas. However, the rest of the molecules remain in the adsorbed state on the molecular layer 41 of the tungsten-containing gas to thereby maintain the molecular layer (a silicon supplying step).

Figure 6B:
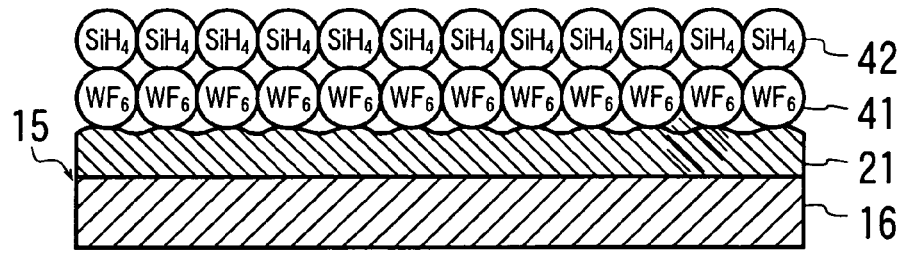

The numeral 42 in FIG. 6b designates the molecular layer of the silicon-containing gas remaining on the surface of the molecular layer 41 of the tungsten-containing gas. In this case, the silicon-containing gas consists of the same gas as the above described reducing gas ($SiH_4$ gas), and the molecular layer 42 of the silicon-containing gas consists of a monomolecular layer of the silicon compound molecule or a multimolecular layer formed by stacking two or more silicon compound molecules.

Figure 6C:
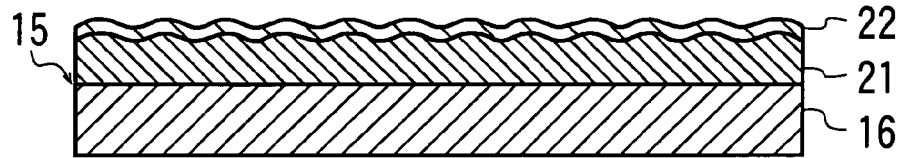

In a state in which the molecular layer 42 of the silicon-containing gas is formed, the object 15 to be processed is maintained at the film forming temperature. Then, the tungsten compound in the tungsten-containing gas is reduced by reacting with the silicon compound in the molecular layer 42 of the silicon-containing gas to thereby form a tungsten silicide film 22 comprising $WSi_x$ (wherein x is an integer equal to or greater than one) on the surface of the tungsten nitride film 21 as shown in FIG. 6c.

When the tungsten supplying step and the silicon supplying step are alternately repeated without supplying the nitriding gas, the tungsten is not nitrided. Therefore, the tungsten silicide film 22 grows.

FIG. 3c shows a state after the tungsten supplying step and the silicon supplying step are repeated until the tungsten silicide film 22 of the desired film thickness is grown; and the numeral 20 in the figure designates a barrier film consisting of the tungsten nitride film 21 and the tungsten silicide film 22.

As described above, the tungsten nitride film 21 is formed continuously over the surface of the insulating film 16, the inner walls of the trenches 17, the inner walls of the holes 18, and the surface of the first electrode films 12 which surface is exposed at the bottom of the hole 18; and the tungsten silicide film 22 is formed so as to cover the entire surface of the tungsten nitride film 21. Thus, the tungsten silicide film 22 is formed continuously over the surface of the insulating film 16, the inner walls of the trenches 17, the inner walls of the holes 18, and the surface of the first electrode films 12 which surface is exposed at the bottom of the hole 18.

Figure 2:
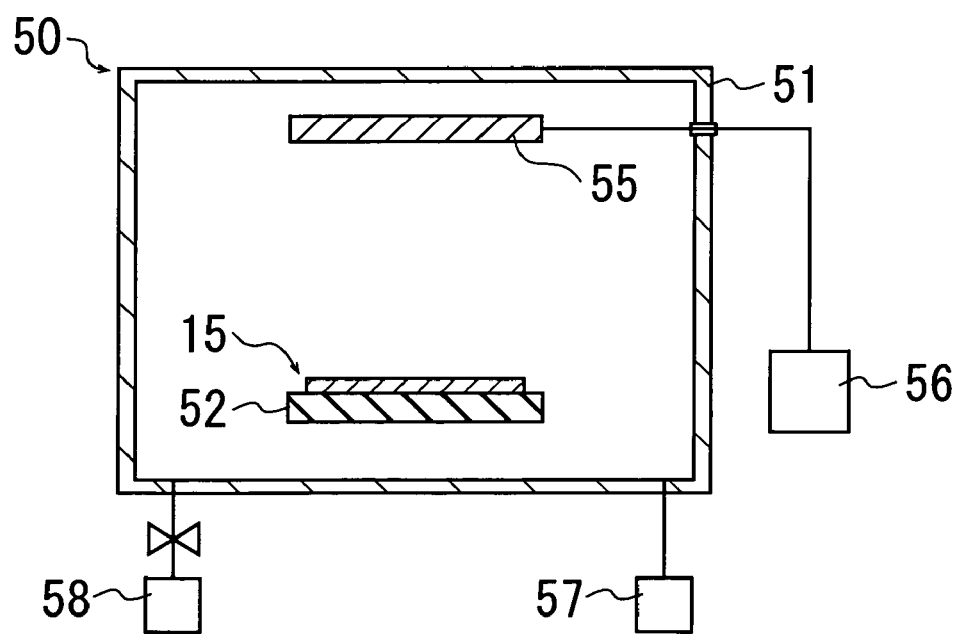
FIG. 2 is a cross-sectional view showing an example of a sputter apparatus used for forming an electrode film.

The numeral 50 in FIG. 2 designates a sputtering apparatus, and the sputtering apparatus 50 comprises a vacuum chamber 51. A vacuum atmosphere is formed inside the vacuum chamber 51 by activating a vacuum evacuation system 58 connected to the vacuum chamber 51. Subsequently, while maintaining the vacuum atmosphere, the object 15 to be processed with the barrier film 20 formed is transported inside the vacuum chamber 51 of the sputtering apparatus 50 and is held by a substrate holder 52.

Subsequently, while continuing the vacuum evacuation, a sputter gas is supplied from a sputter gas supply system 57 to form a sputter atmosphere having a predetermined pressure inside the vacuum chamber 51. Inside the vacuum chamber 51, a target 55 formed of a conductive material (in this case, Cu) is placed in a position opposed to the object 15 to be processed held by the substrate holder 52. By activating a power source 56 to apply a voltage to the target 55, the target 55 is sputtered to emit sputtered particles.

The object 15 to be processed is held by the substrate holder 52 with the surface on which the barrier film 20 is formed directed to the target 55; and the sputtered particles emitted from the target 55 adhere on the surface of the barrier film 20. Thus, a first conductive layer 26 consisting of a conductive material is formed on the surface of the barrier film 20 as shown in FIG. 3d.

The first conductive layer 26 is not separated but formed continuously on the surface of the barrier film 20 above the surface of the insulating film 16, the inner walls of the trenches 17, the inner walls of the holes 18, and the bottom of the holes 18. Thus, when a voltage is applied to a portion of the first conductive layer 26, the voltage with the same polarity is applied over the entire first conductive layer 26.

After the object 15 to be processed with the first conductive layer 26 formed is immersed in an electrolytic plating solution, a positive voltage is applied to an electrode immersed in the electrolytic plating solution, and a negative voltage is applied to the first conductive layer 26. Then, metal ions (in this case, Cu ions) in the electrolytic plating solution migrate toward the surface of the first conductive layer 26. Thus, the metal is deposited on the surface of the first conductive layer 26, and a second conductive layer is grown.

Figure 4A:
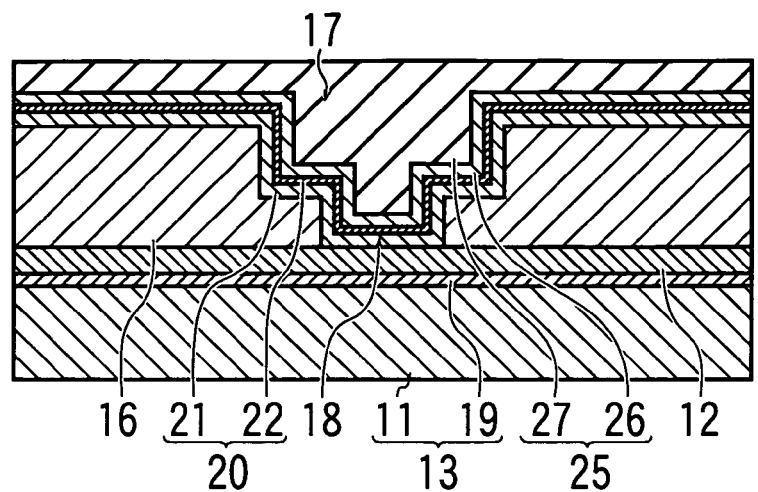
FIGS. 4a and 4b are cross-sectional views for illustrating the second half of the steps of forming the electrode film.

When the voltage is continued to be applied to the first conductive layer 26 to grow the second conductive layer, the holes 18 and the trenches 17 are filled with the second conductive layer 27 as shown in FIG. 4a. The numeral 25 in FIG. 4a designates a conductive layer consisting of the first conductive layer 26 and the second conductive layer 27.

The second conductive layer 27 grown by the electrolytic plating method has a low denseness, and fine holes referred to as microvoids are occasionally generated. These microvoids cause the electric resistance of the electrode film to increase.

The object 15 to be processed with the conductive film 25 formed is then pulled out from the electrolytic plating solution and is placed inside a heating apparatus. The inside of the heating apparatus is vacuum evacuated, and at the same time an annealing gas is supplied thereto. Thus, the inside of the heating apparatus is maintained at a predetermined pressure in advance. When the object to be processed is heated to 200° C. or higher while the vacuum evacuation and the annealing gas supply are continued, the conductive layer 25 is baked to cause the microvoids to disappear (an annealing process).

Generally, the adhesion between a metal film such as the conductive film 25 and a tungsten nitride film is poor. Thus, when the conductive film 25 is directly formed on the surface of the tungsten nitride film 21, metals in the conductive film 25 are sometimes aggregated during annealing to cause deterioration in the film quality of the conductive film 25 and peeling off the conductive film 25 from the tungsten nitride film 21.

More particularly, when the conductive film 25 is formed of copper, a problem occasionally arises in the adhesion with the tungsten nitride film. Thus, when the conductive film 25 is formed of copper, a barrier film having a high adhesion is desired.

In the present invention, the tungsten silicide film 22 is formed on the surface of the tungsten nitride film 21, and subsequently the conductive film 25 is formed on the surface of the tungsten silicide film 22. Thus, Si in the tungsten silicide film 22 is chemically bound to a metal (in this case, Cu) in the conductive film 25, resulting in a very high adhesion between the tungsten silicide film 22 and the conductive film 25. Thus, metal agglomeration does not occur in the conductive film 25 during annealing.

Next, the surface of the object 15 to be processed of the side on which surface the conductive film 25 is formed is polished until the surface of the insulating film 16 is exposed. The conductive film 25 and the barrier film 20 located above the insulating film 16 are then removed. However, the conductive film 25 and the barrier film 20 located inside each of the trenches 17 and each of the holes 18 are not removed but remain thereon (a polishing step). Therefore, the portions of the conductive film 25 remaining inside the trenches 17 are separated from each other to thereby obtain a semiconductor device 10 as shown in FIG. 4b.

Figure 4B:
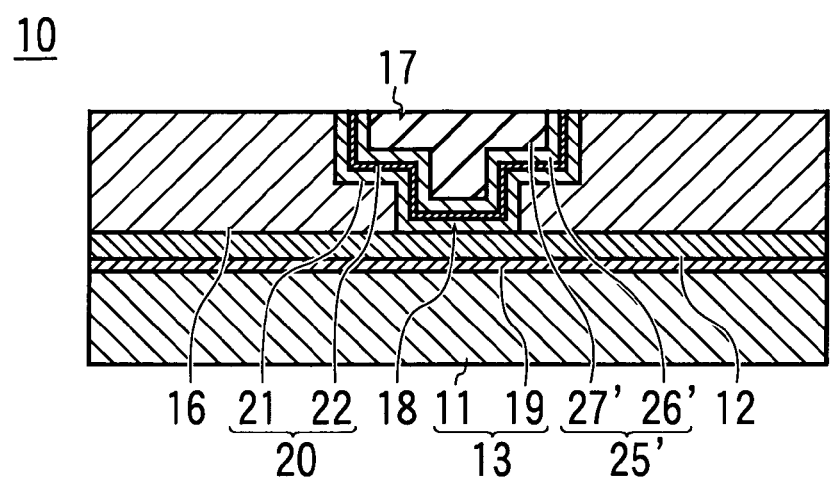

The numeral 25' in FIG. 4b designates the second electrode film consisting of the conductive films 25 separated from each other. Since the adhesion between the conductive film 25 and the barrier film 20 is high, the conductive film 25 does not peel off during the polishing step; and thus, a defect is not generated in the second electrode film 25'. Since the barrier film 20 is disposed between the second electrode film 25' and the insulating film 16, the metal constituting the second electrode film 25' is not injected into the insulating film 16.

As described above, the insulating film 16 is placed in the portion of the bottom of the trench 17 which portion is not occupied by the hole 18. Thus, in the portion which is not occupied by the hole 18, the second electrode film 25' is insulated from the first electrode films 12 by the insulating film 16. However, the insulating film 16 is not placed in the portion in which the hole 18 is located, and the inside of the hole 18 is filled with the second conductive layer 27' separated in the polishing step. Thus, the first electrode films 12 and the second electrode film 25' are connected to each other in the portion in which the hole 18 is located.

The insulative thin film 19 is placed between the first electrode film 12 and the semiconductor substrate 11. However, a contact hole is provided in the insulative film 19 for connecting an internal circuit of the semiconductor substrate 11 to the first electrode film 12; and thus, the first electrode film 12 is electrically connected to the internal circuit of the semiconductor substrate 11. Therefore, if the second electrode 25' is connected to an external circuit, electric signals can be input and output between the semiconductor substrate 11 and the external circuit.

EXAMPLES

Example 1

A single cycle of the first film forming step involves performing the following steps once in the following order: the above described first material gas supplying step; the above described reducing step; the above described second material gas supplying step; and the above described nitriding step. The second film forming step involves performing the tungsten supplying step and the silicon supplying step once in the described order. A silicon substrate on which the insulating film 16 is not patterned (a blanket substrate) was used as the object 15 to be processed. The barrier film 20 was formed on the surface of the insulating film 16 by performing the first film forming step 17 times to deposit the tungsten nitride film 21 and subsequently performing the second film forming step twice to deposit the tungsten silicide film 22. Subsequently, a copper film having a film thickness of 400 nm was deposited on the surface of the barrier film 20 by means of the sputtering method to thereby form the electrode film.

In this case, the same gas ($WF_6$ gas) was used for the first and second material gases and the tungsten-containing gas, and the flow rate of each of the gases was 5 sccm. The same gas ($SiH_4$ gas) was used for the reducing gas and the silicon-containing gas, and the flow rate of each of the gases was 50 sccm. The flow rate of the nitriding gas ($NH_3$ gas) was 11 sccm.

In the first 2 times out of the first film forming steps performed 17 times, the introduction time of the first and second material gases was 5 seconds, and the evacuation time thereof was 2 seconds. In addition, the introduction time of the reducing gas was 10 seconds, and the evacuation time thereof was 10 seconds. In the subsequent 15 times first film forming steps, the introduction time and the evacuation time of each of the gases were the same as those in the 2 times first film forming steps except that the evacuation time of the first and second material gases was 10 seconds. In the second film forming step, the introduction time of the tungsten-containing gas was 5 seconds, and the evacuation time thereof was 10 seconds. In addition, the introduction time of the silicon-containing gas was 10 seconds, and the evacuation time thereof was 10 seconds.

Comparative Example 1

The same object to be processed as in Example 1 described above was used. The first film forming step was performed 19 times to deposit the barrier film consisting of the tungsten nitride film, but the second film forming step was not performed. Subsequently, the electrode film was formed on the surface of the barrier film under the same conditions as in Example 1.

In this case, the kind and the flow rate of each of the gases were the same as in Example 1. In the first 5 times out of the first film forming steps performed 19 times, the introduction time of the first and second material gases was 5 seconds, and the evacuation time thereof was 2 seconds. In addition, the introduction time of the reducing gas was 10 seconds, and the evacuation time thereof was 10 seconds. Also, the introduction time of the nitriding gas was 20 seconds, and the evacuation time thereof was 10 seconds. In the subsequent 14-step first film forming step, the introduction time and the evacuation time of each of the gases were the same as those in the first 5 times first film forming steps except that the evacuation time of the first and second material gases was 10 seconds.

The peel test described below was performed on the barrier films formed in the above described Example 1 and Comparative Example 1.

<Peel Test>

Grid-shaped scratches were drawn on the surface of the electrode film with a diamond pen to provide 9 scratched portions 61 each having 4 square evaluation areas 62 enclosed by the scratches as shown in FIG. 11. Subsequently, a transparent adhesive tape was applied to the surface of the electrode film. The adhesive tape was then peeled off, and the surface of the electrode film was observed.

The evaluation was made by the following criteria: 4 points in the case that no peeling off of the electrode film was found in the evaluation areas 62 (FIG. 12a); 3 points in the case that peeling was found along the line-shaped scratch (FIG. 12b); 2 points in the case that peeling was found in a corner of the evaluation area 62 (FIG. 12c); 1 point in the case that one of the evaluation areas 62 was entirely peeled off (FIG. 12d); and 0 points in the case that all of the 4 evaluation areas 62 were peeled off (FIG. 12e), and the sum of the evaluation points of 9 scratched portions 61 was determined. It is shown that the larger the evaluation point is, the higher the adhesion between the copper film (the electrode film) and the barrier film is. If peeling was not found in all of the 9 scratched areas, the sum of the evaluation points is 36 points.

The peel test was performed on the deposited electrode films in Example 1 and Comparative Example 1. Peeling was not found in the electrode film of Example 1, and thus the sum of the evaluation points was 36 points. On the other hand, the sum of the evaluation points of the electrode film of Comparative Example 1 was 27 points. The peeling portion of the electrode film of Comparative Example 1 was observed, and it was found that the tungsten nitride film was exposed at the peeling portion. Thus, the peeling was found to occur at the boundary between the tungsten nitride film and the electrode film.

Example 2

The object 15 to be processed was subjected to pretreatment by exposing to a plasma gas consisting of $NH_3$ gas. A single cycle of the first film forming step involves performing the following steps once in the following order: the first material gas supplying step; the reducing step; the second material gas supplying step; and the nitriding step. The second film forming step involves performing the tungsten supplying step and the silicon supplying step once in the described order. The tungsten nitride film was formed by performing the first film forming step 16 times, and subsequently the tungsten silicide film 22 was formed by performing the second film forming step 4 times to thereby form the barrier film 20 consisting of the tungsten nitride film 21 and the tungsten silicide film 22. Further, a copper film having a film thickness of 10 nm was deposited on the surface of the barrier film 20 by means of the sputtering method to thereby form the electrode film consisting of copper.

Example 3

The object 15 to be processed was subjected to the pretreatment under the same conditions as in Example 2. The tungsten nitride film 21 was formed on the surface of the insulating film 16 by means of the sputtering method, and subsequently the tungsten silicide film 22 was formed on the surface of the tungsten nitride film 21 under the same conditions as in Example 2 to thereby form the barrier film 20 consisting of the tungsten nitride film 21 and the tungsten silicide film 22. Subsequently, the electrode film was formed under the same conditions as in Example 2.

Comparative Example 2

The barrier film consisting of the tungsten nitride film was formed on the surface of the pretreated insulating film 16 by performing the above first film forming step 20 times. In this case, the second film forming step was not performed. Subsequently, the electrode film was formed on the surface of the barrier film under the same conditions as in Example 2.

Comparative Example 3

The object 15 to be processed was heated in a hydrogen gas atmosphere for the annealing process. Subsequently, a TaN film having a film thickness of 7.5 nm was formed on the surface of the insulating film 16 by means of an SIS (Self Ionized Sputter) method. Then, a Ta film having a film thickness of 7.5 nm was formed on the surface of the TaN film to form the barrier film consisting of the Ta film and the TaN film. Subsequently, the electrode film was formed on the surface of the barrier film under the same conditions as in Example 2.

Comparative Examples 4 and 5

The object 15 to be processed was subjected to the annealing processing under the same conditions as in Comparative Example 3, and the barrier film consisting of tungsten or tungsten nitride was formed on the surface of the insulating film 16 by means of the sputter method. Subsequently, the electrode film was formed on the surface of each barrier film under the same conditions as in Example 2.

A Cu film having a film thickness of 10 nm was formed by means of the sputter method on the surface of the barrier films formed in the above Example 2 and the above Comparative Examples 2 to 4 to thereby form the electrode film consisting of Cu. Each of the objects to be processed 15 with the electrode film formed was placed inside the heating apparatus. While the heating apparatus was vacuum evacuated, a mixture gas of $H_2$ gas and $N_2$ gas ($H_2$: 50%) serving as the annealing gas was supplied thereto. While the pressure inside the heating apparatus was maintained at 13.3 Pa, each of the objects to be processed 15 was subjected to annealing at a heating temperature of 200° C., 250° C., or 300° C. FIGS. 13 to 28 show electron micrographs of the surface of the electrode films (a central portion) after the annealing processing.

Figure 13:
FIG. 13 is an electron micrograph in the case where the electrode film of Example 2 is heated at 200° C.
Figure 14:
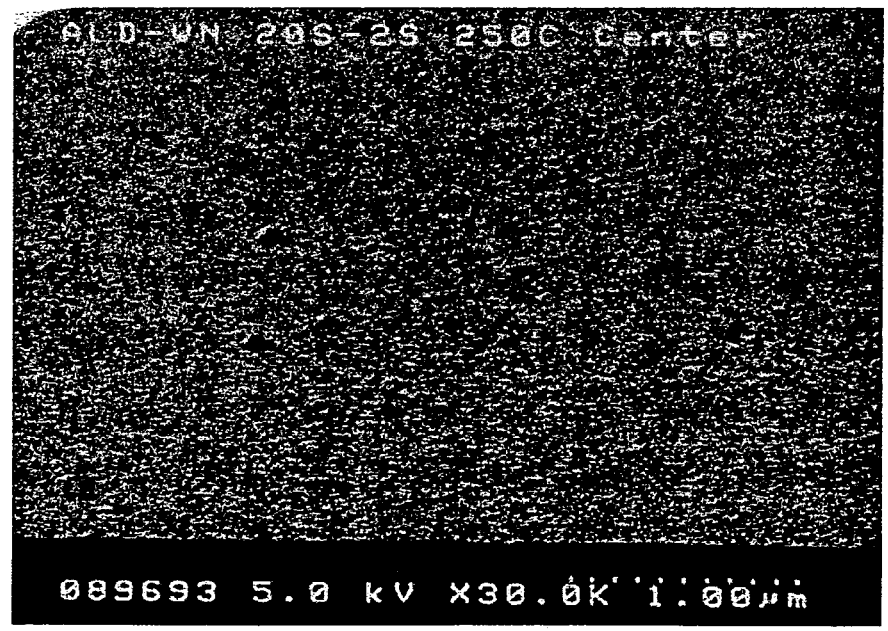
FIG. 14 is an electron micrograph in the case where the electrode film of Example 2 is heated at 250° C.
Figure 15:
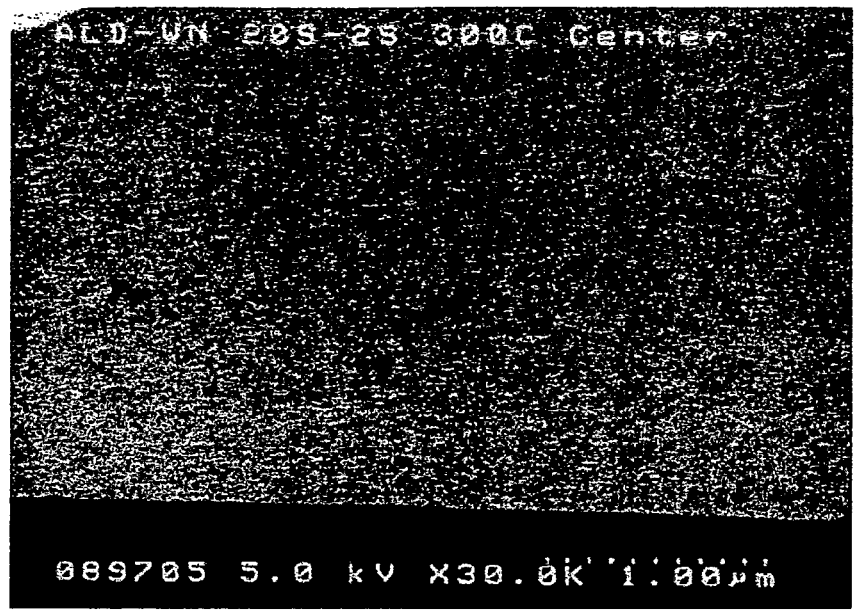
FIG. 15 is an electron micrograph in the case where the electrode film of Example 2 is heated at 300° C.
Figure 16:
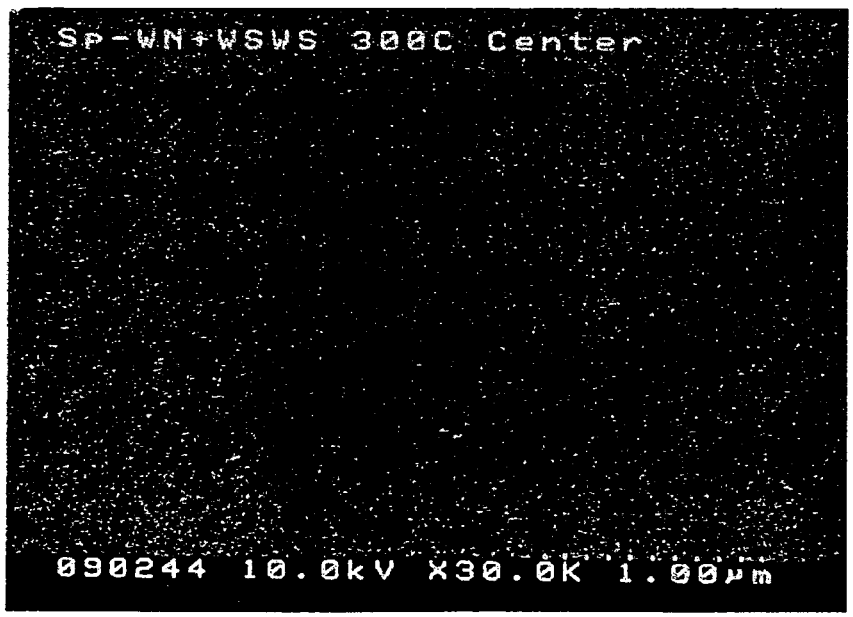
FIG. 16 is an electron micrograph in the case where the electrode film of Example 3 is heated at 300° C.

FIGS. 13 to 15 are electron micrographs in the case where the electrode films deposited in Example 2 were annealed at 200° C., 250° C., and 300° C., respectively. The agglomeration of copper was not found on the surface of each of the electrode films. Even when the electrode film was heated at 300° C., the surface of the electrode film remained planar. FIG. 16 is an electron micrograph in the case where the electrode film deposited in Example 3 was annealed at 300° C. Also in this case, the agglomeration of copper was not found in the electrode film.

Figure 17:
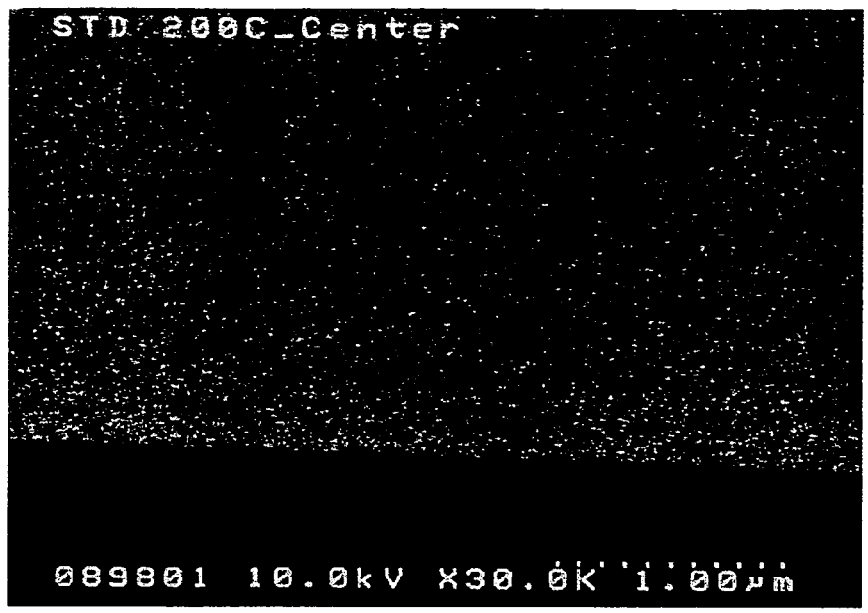
FIG. 17 is an electron micrograph in the case where the electrode film of Comparative Example 2 is heated at 200° C.
Figure 18:
FIG. 18 is an electron micrograph in the case where the electrode film of Comparative Example 2 is heated at 250° C.
Figure 19:
FIG. 19 is an electron micrograph in the case where the electrode film of Comparative Example 2 is heated at 300° C.

FIGS. 17 to 19 are electron micrographs in the case where the electrode films deposited in Comparative Example 2 were annealed at 200° C., 250° C., and 300° C., respectively. When the heating temperature was 250° C. or higher, the agglomeration was found in the electrode films. Therefore, it has been found that, even when the tungsten nitride film is formed by repeatedly performing the reduction product deposition step and the tungsten nitride deposition step, the adhesion between the barrier film and the electrode film is poor if the tungsten silicide film is not formed.

Figure 20:
FIG. 20 is an electron micrograph in the case where the electrode film of Comparative Example 3 is heated at 200° C.
Figure 21:
FIG. 21 is an electron micrograph in the case where the electrode film of Comparative Example 3 is heated at 250° C.
Figure 22:
FIG. 22 is an electron micrograph in the case where the electrode film of Comparative Example 3 is heated at 300° C.

FIGS. 20 to 22 are electron micrographs in the case where the electrode films deposited in Comparative Example 3 were annealed at 200° C., 250° C., and 300° C., respectively. When the Ta film and the TaN film were formed in place of the tungsten nitride film and the tungsten silicide film, the agglomeration occurred in the electrode films if the heating temperature was 250° C. or higher.

Figure 23:
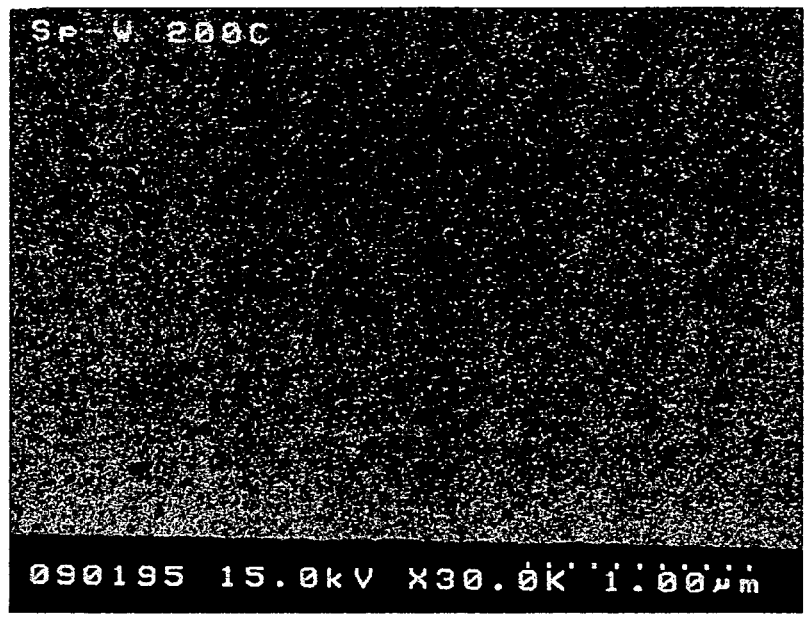
FIG. 23 is an electron micrograph in the case where the electrode film of Comparative Example 4 is heated at 200° C.
Figure 24:
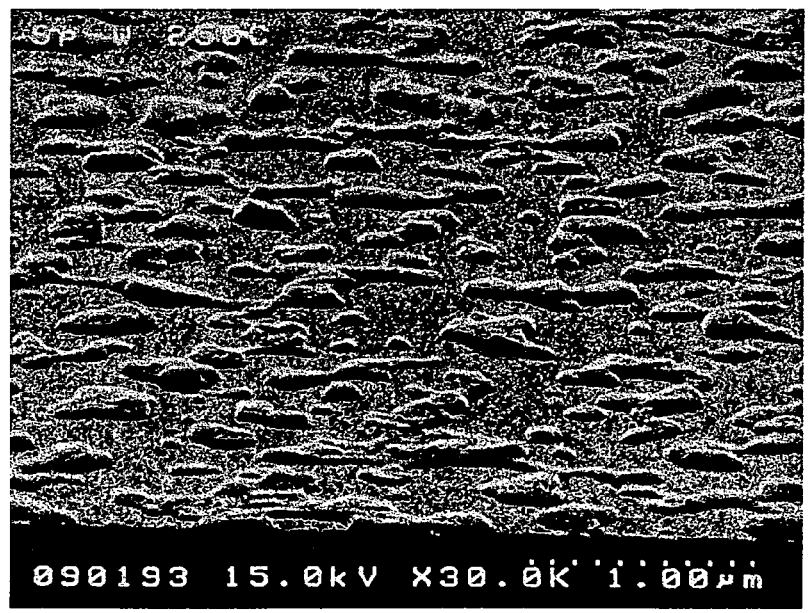
FIG. 24 is an electron micrograph in the case where the electrode film of Comparative Example 4 is heated at 250° C.
Figure 25:
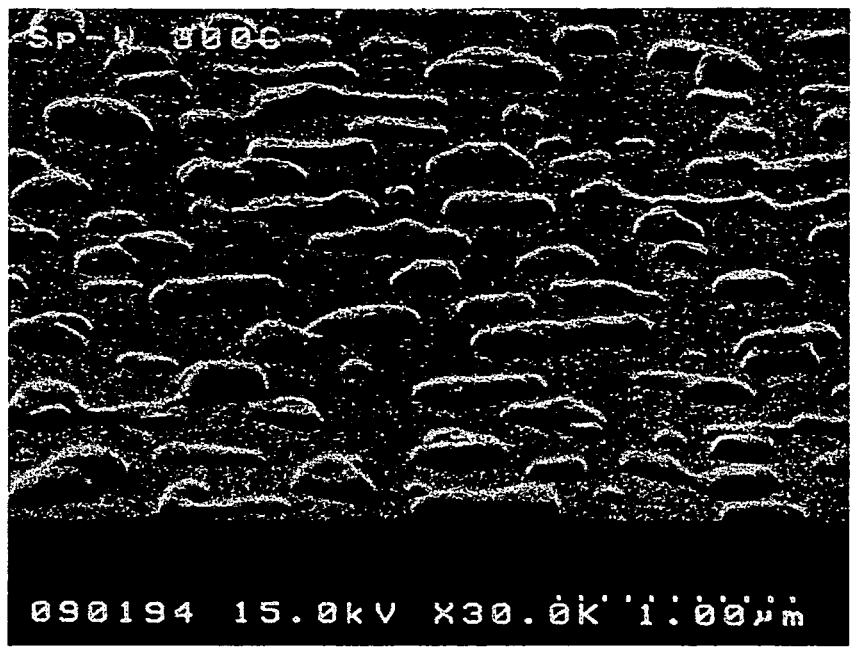
FIG. 25 is an electron micrograph in the case where the electrode film of Comparative Example 4 is heated at 300° C.
Figure 26:
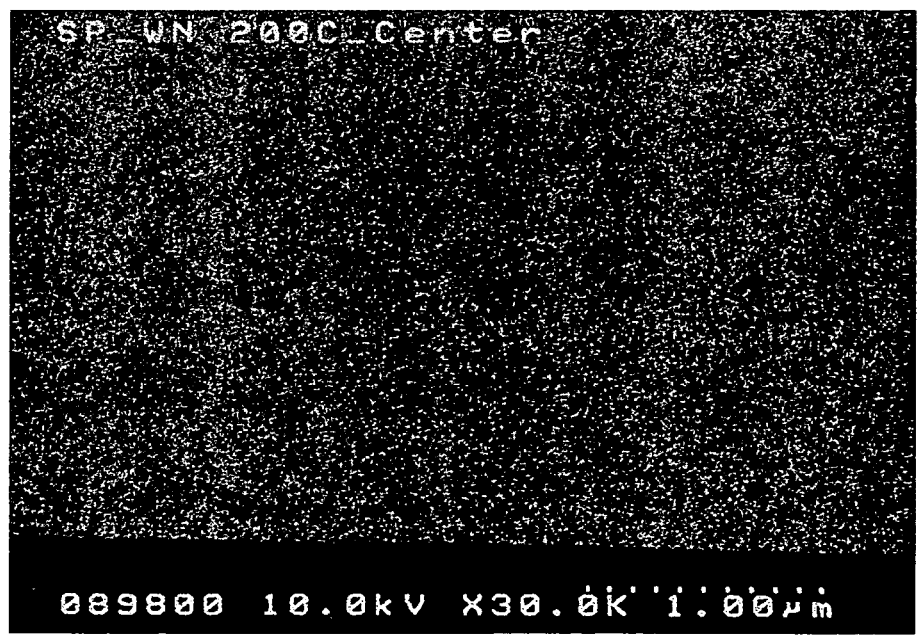
FIG. 26 is an electron micrograph in the case where the electrode film of Comparative Example 5 is heated at 200° C.
Figure 27:
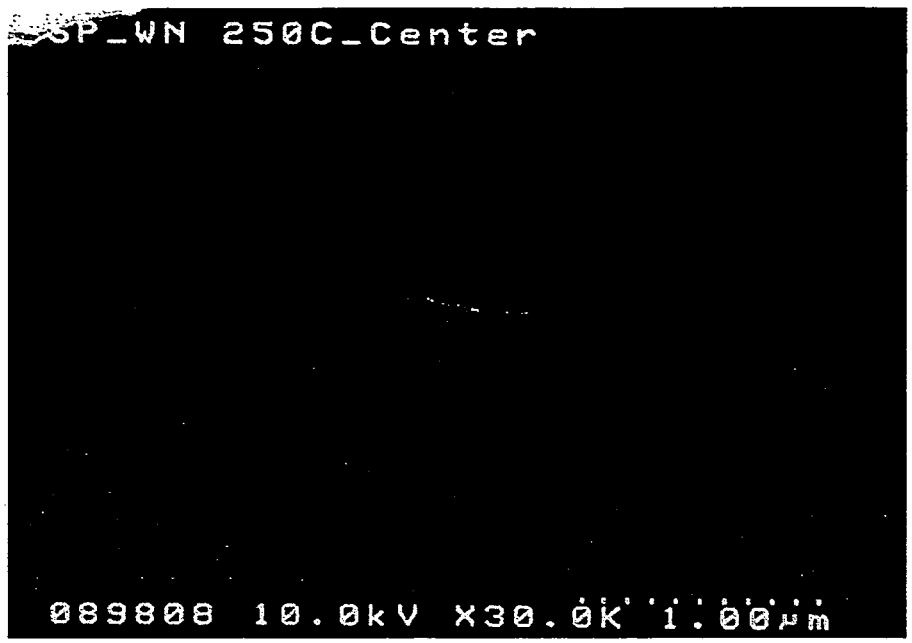
FIG. 27 is an electron micrograph in the case where the electrode film of Comparative Example 5 is heated at 250° C.
Figure 28:
FIG. 28 is an electron micrograph in the case where the electrode film of Comparative Example 5 is heated at 300° C.

Further, FIGS. 23 to 25 are electron micrographs in the case where the electrode films deposited in Comparative Example 4 were annealed at 200° C., 250° C., and 300° C., respectively. FIGS. 26 to 28 correspond to the case where the electrode films deposited in Comparative Example 5 were annealed at 200° C., 250° C., and 300° C., respectively. The agglomeration in the electrode film was found to occur in Comparative Examples 4 and 5 when the heating temperature was high. Particularly, in Comparative Example 4 where the barrier film consisting of the tungsten film was formed, the agglomeration occurred at 250° C. Thus, it has been found that the adhesion of tungsten with the electrode film (the copper film) is poorer than that of tungsten nitride.

In Examples 2 and 3 in which the tungsten silicide film was formed on the surface of the barrier film, the adhesion with respect to the electrode films is significantly higher than that of Comparative Example 4. It is presumed that this is because silicon in the tungsten silicide film reacts with a component (for example, Cu) of the electrode film.

Example 4

The same object 15 to be processed as that used in Example 1 was used, and the tungsten nitride film 21 was formed on the surface of the insulating film 16 by performing the above described first film forming step 46 times. Subsequently, the tungsten silicide film 22 was formed on the surface of the tungsten nitride film 21 by performing the above described second film forming step 8 times to thereby obtain the barrier film 20.

In this case, the same conditions as in Example 1 were used for the kind of the gas in each of the film forming steps and the flow rate of each of the gases. The introduction time of the first and second material gases and the tungsten-containing gas was 5 seconds, and the evacuation time thereof was 10 seconds. The introduction time of the reducing gas and the silicon-containing gas was 10 seconds, and the evacuation time thereof was 10 seconds. The introduction time of the nitriding gas was 20 seconds, and the evacuation time thereof was 10 seconds.

Comparative Example 6

The same object 15 to be processed as that used in Example 1 was used. The barrier film consisting of the tungsten nitride film was obtained by repeating only the first film forming step 50 times. The second film forming step was not performed. In this case, the kind of each of the gases was the same as that in Example 1. Further, the flow rate of the first and second material gases was 6.9 sccm. The flow rate of the reducing gas was 112 sccm, and the flow rate of the nitriding gas was 11 sccm. The introduction time and the evacuation time of each of the gases were each 15 seconds.

Figure 9:
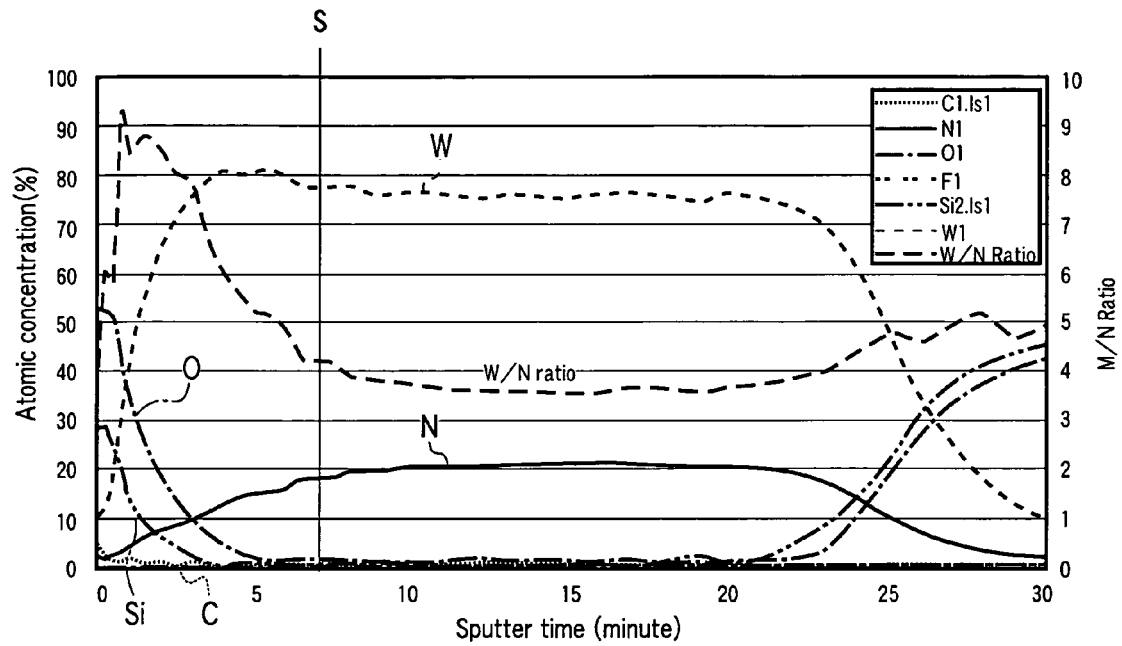
FIG. 9 is a graph showing results of AES analysis of the barrier film formed in Example 4.
Figure 10:
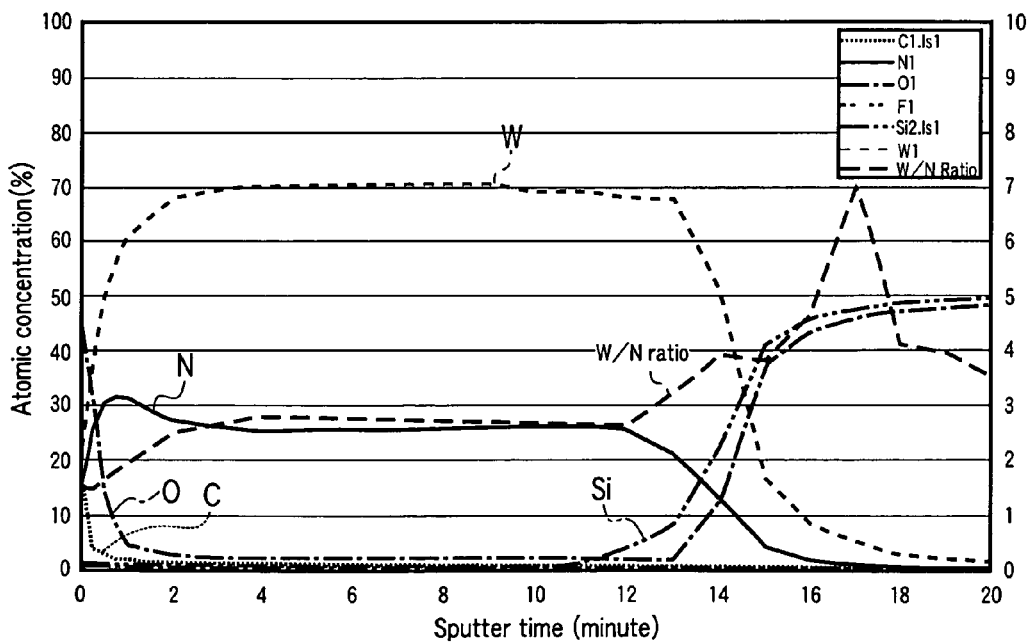
FIG. 10 is a graph showing results of AES analysis of the barrier film formed in Comparative Example 6.

FIGS. 9 and 10 are graphs showing the results of AES (Auger Electron Spectroscopy) analysis of the barrier films deposited in Example 4 and Comparative Example 6. The vertical axis of FIGS. 9 and 10 represents atomic concentration (%), and the horizontal axis represents sputter time (minute). The longer the sputter time, the deeper the depth from the surface of the barrier film 20.

As is shown in FIG. 9, in the barrier film deposited in Example 4, the atomic concentrations of tungsten (W) and silicon (Si) are high from the surface to the depth corresponding to a sputter time of s. This shows that, by alternately supplying the tungsten-containing gas and the silicon-containing gas, tungsten is deposited in a large amount, and at the same time unreacted silicon which has not reacted during the reduction reaction of the silicon-containing gas remains on the object 15 to be processed to thereby form the tungsten silicide film 22.

Further, when the depth from the surface exceeds the depth corresponding to the sputter time s, the concentration of nitrogen (N) becomes high. On the other hand, the atomic concentrations of tungsten and silicon become low. Thus, it has been found that the tungsten nitride film is formed under the tungsten silicide film 22.

As shown in FIG. 10, in the barrier film deposited in Comparative Example 6, the atomic concentration of Si is very low from the surface to the depth where the insulating film 16 is exposed (a sputter time of about 13 minutes). This shows that, when the reduction product deposition step and the tungsten nitride deposition step are repeatedly performed, Si atoms are desorbed during the reduction reaction, and thus Si atoms do not remain in the film.

Examples 5 and 6

On the surface of the insulating film 16 of the same object 15 to be processed as that used in Examples 1 to 4, the tungsten silicide film 22 was formed by performing the tungsten supplying step once and the silicon supplying step once (Example 5). Separately, on the same object 15 to be processed as that in Example 5, the tungsten silicide film was formed by performing the tungsten supplying step once, the silicon supplying step once, and the tungsten supplying step once in the described order (Example 6).

Figure 7:
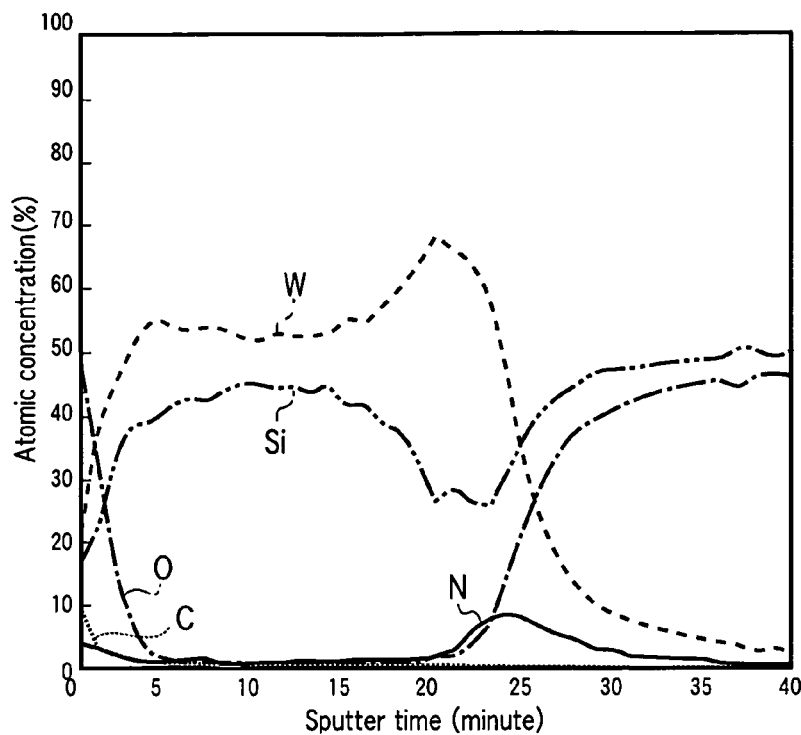
FIG. 7 is a graph showing results of AES analysis of the tungsten silicide film formed in Example 5.
Figure 8:
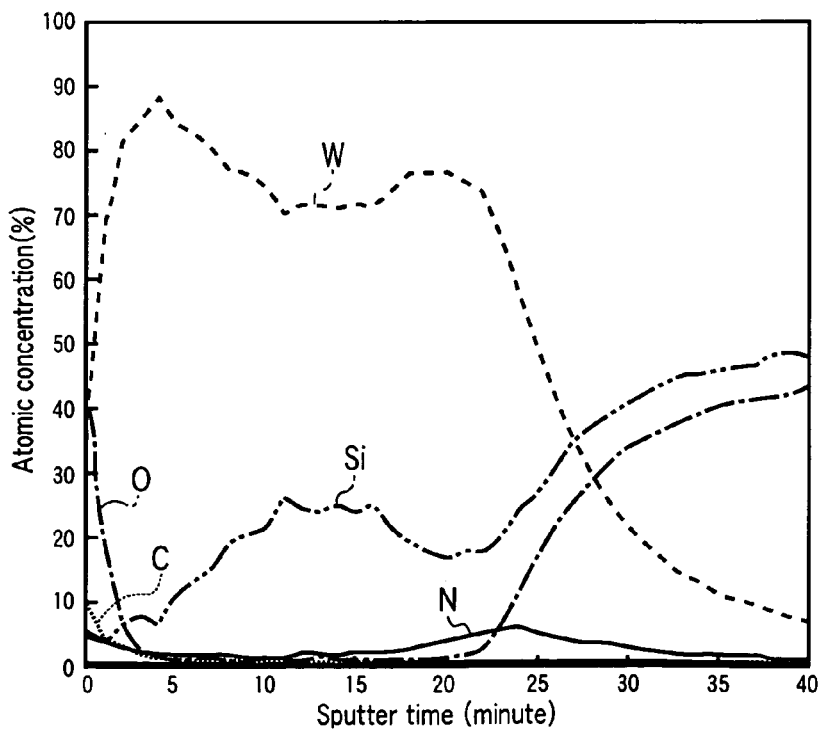
FIG. 8 is a graph showing results of AES analysis of the tungsten silicide film formed in Example 6.

FIGS. 7 and 8 are graphs showing the results of AES analysis of the tungsten silicide films formed in Examples 5 and 6. As is clear from comparison of FIGS. 7 and 8, the atomic concentration of tungsten in Example 6 is higher than that in Example 5. Thus, it has been found that, if the number of the tungsten supplying steps is increased, the tungsten silicide film having a high atomic concentration of tungsten is formed.

Therefore, by changing the number of the tungsten supplying steps and the number of the silicon supplying steps, the concentrations of silicon and tungsten contained in the tungsten silicide film can be adjusted to the desired values.

The case where the silicon substrate is used as the semiconductor substrate 11 has been described above, but the present invention is not limited thereto. Various semiconductor substrates (such as, a gallium arsenide substrate) may be used. The conductive material constituting the second electrode film 25' is not limited to copper provided it has a high adhesion with tungsten silicide.

The case where the sputter method is used to deposit the first conductive layer 26 has been described above, but the present invention is not limited thereto. Various film deposition methods such as an evaporation method and a CVD (Chemical Vapor Deposition) method may be used.

No particular limitation is imposed on the film deposition method for the tungsten nitride film, and the sputter method or a similar method may be used as described above. However, in the method in which the reduction product deposition step and the tungsten nitride deposition step are repeatedly performed to form the tungsten nitride film as in Examples 1 and 2, the step of depositing the tungsten silicide film can be performed in the same vacuum chamber. Thus, the film forming steps are simple, and the manufacturing cost is low.

When annealing is performed after the formation of the electrode film, the heating temperature suitable to the present application is 200° C. or higher, and more preferably 250° C. or higher.

The case where the first and second material gases and the tungsten-containing gas consist of the same gas has been described above, but the present invention is not limited thereto. Different kinds of gases may be used for each of the first and second material gases and the tungsten-containing gas. Alternatively, any two gases among these three gases may consist of the same kind of gas, and the remaining one gas may consist of another kind of gas. However, if the first and second material gases and the tungsten-containing gas consist of the same kind of gas, the gases in the first and second material gas supplying steps and the tungsten supplying step can be supplied from the same gas cylinder. Thus, the structure of the apparatus is simplified.

Examples of the tungsten compound gas used for the first and second material gases and the tungsten-containing gas include, in addition to tungsten halide gases such as tungsten hexafluoride gas and tungsten hexachloride gas ($WCl_6$), tungsten oxyhalide gases such as $WOF_2$, $WOF_4$, $WOCl_2$, and $WOCl_4$, organometallic compound gases such as $W(OC_2H_5)_5$ and $W(OC_2H_5)_6$, and tungsten carbonyl gases such as $W(CO)_5$ and $W(CO)_6$.

In addition, each of the first and second material gases and the tungsten-containing gas may consist of one kind of tungsten compound gas, or a mixture of two or more kinds of tungsten compound gases may be used.

Further, when the first material gas, the second material gas, or the tungsten-containing gas is supplied to the vacuum chamber, the amount of the gas adsorbed to the object to be processed can be controlled by additionally supplying a diluting gas (such as, argon gas) to dilute the first material gas, the second material gas, or the tungsten-containing gas by the diluting gas.

Moreover, when the reducing gas, the nitriding gas, and the silicon-containing gas are supplied, the concentration of the above supplied gas can be controlled by additionally supplying a diluting gas (such as, argon gas) to thereby control the amount of the gas adsorbed to the object to be processed.

In addition, if oxygen gas serving as an additive gas is supplied together with the reducing gas, an effect can be obtained in which the adhesion between the deposited tungsten and the substrate is improved.

The reducing gas and the silicon-containing gas are not limited to mono-silane ($SiH_4$) gas. Any gas such as disilane gas ($Si_2H_6$) or dichlorosilane gas ($SiH_2Cl_2$) may be used provided it reduces the tungsten compound.

The nitriding gas is not limited to ammonia gas. Any gas such as hydrazine gas ($N_2H_4$) or a hydrazine derivative gas in which hydrogen in hydrazine is substituted by a $C_xH_y$ group (wherein x and y are arbitrary integers) may be used so long as it nitrides tungsten.

The cleaning gas used in the pretreatment step is not limited to ammonia gas, and the cleaning gas may be selected from various gases (such as, argon gas) depending on the purpose of its use. In addition, if a rotating shaft is provided in the substrate holder 7 and each of the film forming steps is performed while the object 15 to be processed is rotated by the rotating shaft in a horizontal plane, the tungsten nitride film having a uniform film thickness can be formed on the surface of the object 15 to be processed.

No particular limitation is imposed on the ultimate pressure when each gas is supplied. In accordance with purposes for film formation, the pressure is set to $10^{-2}$ Pa or higher and lower than $10^2$ Pa, and more preferably a few Pa or lower.

The case where the temperature of the object 15 to be processed is maintained at the same temperature during the first and second material gas supplying steps, the reducing step, the nitriding step, the tungsten supplying step, and the silicon supplying step has been described above, but the present invention is not limited thereto. The temperature of the object 15 to be processed may be changed for each of the steps, and the heating temperature is preferably 200° C. or higher and 350° C. or lower.

The case where the first and second gas supplying steps, the reducing step, the nitriding step, the tungsten supplying step, and the silicon supplying step are performed in the same vacuum chamber 2 has been described above, but the present invention is not limited thereto. Each of the steps may be performed in different vacuum chambers.

When one cycle is composed of the first material gas supplying step, the reducing step, the second material gas supplying step, and the nitriding step and the cycle is performed a plurality of times to form a film, the same gas may be used for each of the first and second material gases, the reducing gas, and the nitriding gas in all of the cycles. Alternatively, the kind of each of the first and second material gases, the reducing gas, and the nitriding gas may be changed for each cycle.

Further, when one cycle is composed of the tungsten supplying step and the silicon supplying step and the cycle is repeatedly performed a plurality of times to form the tungsten silicide film, the same gas may be used as each of the tungsten-containing gas and the silicon-containing gas in all of the cycles. Alternatively, the kind of each gas may be changed for each cycle.

Moreover, in each cycle, the number of the first material gas supplying steps, the number of the reducing steps, the number of the second material gas supplying steps, and the number of the nitriding steps are not required to be the same.

The case where the reduction product deposition step is achieved by performing the reducing step after the first material gas supplying step has been described above, but the present invention is not limited thereto. The reducing gas may be adsorbed on the surface of the object 15 to be processed in the reducing step; and subsequently, the reducing gas adsorbed on the surface of the object 15 to be processed may be brought into contact with the first material gas in the first material gas supplying step to thereby deposit the reduction product.

Further, the tungsten nitride deposition step is not limited to the case where the nitriding step is performed after the second material gas supplying step. The nitriding gas may first be adsorbed on the object 15 to be processed in the nitriding step; and subsequently, the nitriding gas adsorbed on the object 15 to be processed may be brought into contact with the second material gas in the second material gas supplying step to thereby deposit tungsten nitride. Alternatively, the tungsten nitride deposition step and the reduction product deposition step may be repeated in the described order to thereby form the tungsten nitride film 21.

The case where the inside of the vacuum chamber 2 is vacuum-evacuated after the supply of the first material gas, the second material gas, the reducing gas, the nitriding gas, the tungsten-containing gas, or the silicon-containing gas is stopped has been described above, but the present invention is not limited thereto. After the supply of each of the supplied gases is stopped, a purge gas may be supplied to the vacuum chamber 2 while the vacuum evacuation is continued to thereby purge the supplied gas from the vacuum chamber 2 by the purge gas. No particular limitation is imposed on the kind of the purge gas used in the present invention. Preferably, the purge gas does not react with the first and second material gases, the tungsten-containing gas, tungsten, tungsten nitride, tungsten silicide, and a semiconductor and a metal exposed at the surface of the object to be processed. An inert gas such as nitrogen, argon, or helium may be used.

Further, when each of the first material gas, the second material gas, the reducing gas, the nitriding gas, the tungsten-containing gas, and the silicon-containing gas is supplied, the above described purge gas may be additionally supplied to the inside of the vacuum chamber 2 as a diluting gas. In this case, when the supply of the first material gas, the second material gas, the reducing gas, or the nitriding gas is stopped, the supply of the purge gas is not required to be stopped.

What is claimed is:

1. A method for forming a barrier film by placing an object to be processed in a vacuum atmosphere and forming a barrier film on a surface of the object to be processed, the method comprising:

a first material gas supplying step of supplying a first material gas containing a gas of a tungsten compound to the vacuum atmosphere, and subsequently evacuating the first material gas from the vacuum atmosphere, a reducing step of supplying to the vacuum atmosphere a reducing gas of which reduces the tungsten compound, and subsequently evacuating the reducing gas from the vacuum atmosphere, wherein the reducing gas reacts the tungsten compound on the object so that tungsten reduction product is formed on the object, a second material gas supplying step of supplying a second material gas containing a gas of a tungsten compound to the vacuum atmosphere, and subsequently evacuating the second material gas from the vacuum atmosphere, wherein the a tungsten is formed on the object by reacting the tungsten reduction product on the object so that the tungsten layer is formed on the object, a nitriding step of supplying to the vacuum atmosphere a nitriding gas containing nitrogen in its chemical structure and which reacts with the tungsten on the object to generate tungsten nitride, and subsequently evacuating the nitriding gas from the vacuum atmosphere, a third material gas supplying step of supplying a third material gas containing a gas of a tungsten compound to the vacuum atmosphere, and subsequently evacuating the third material gas from the vacuum atmosphere, and a silicon supplying step of supplying a silicon-containing gas containing a gas of a silicon compound to the vacuum atmosphere, and subsequently evacuating the silicon-containing gas from the vacuum atmosphere, wherein a plural of the silicon supplying step is performed more frequently at a upper side of the barrier film than the number of performing the silicon supplying step at lower side.

2. The method for forming a barrier film according to claim 1, wherein the first material gas supplying step, the reducing step, the second material gas supplying step, the nitriding step, the third material gas supplying step, and the silicon supplying step are performed in a same vacuum chamber.

3. The method for forming a barrier film according to any one of claims 1 and 2, wherein the reducing gas contains a gas of a silicon compound which is the same gas of the gas of a silicon compound in the silicon-containing gas.

4. The method for forming a barrier film according to claim 3, further comprising:
a reduction product deposition step of depositing a reduction product of a tungsten compound by continuously performing the first material gas supplying step and the reducing step, wherein either one of the first material gas supplying step and the reducing step is performed first and the other step is performed thereafter; and
a tungsten nitride deposition step of depositing tungsten nitride by continuously performing the second material gas supplying step and the nitriding step, wherein either one of the second material gas supplying step and the nitriding step is performed first and the other step is performed thereafter,
the reduction product deposition step and the tungsten nitride deposition step being alternately repeated.

5. The method for forming a barrier film according to claim 1, wherein the first material gas, the second material gas and the third material gas contain a same gas of a tungsten compound.

6. The method for forming a barrier film according to claim 1, wherein
the first material gas supplying step uses at least one tungsten compound as the first material gas selected from the group consisting of $WF_6$, WOF and $WOF_4$,
the reducing step uses at least one silane gas as the reducing gas selected from the group consisting of mono-silane gas, disilane gas and dichlorosilane gas, and as a result, the tungsten silicide is produced as the tungsten reduction product,
the second material gas supplying step uses at least one tungsten compound as the second material gas selected from the group of $WF_6$, WOF and $WOF_4$,
the reaction of the tungsten reduction product bond silicon included in the tungsten silicide and fluorine included in the tungsten compound comprising the second material gas and thus formed silane fluoride is desorbed, and
the nitriding step uses at least one nitriding gas selected from the group consisting of ammonia gas, hydrazine gas, hydrazine derivative gas.

7. The method for forming a barrier film according to claim 1, wherein a temperature of the object is maintained in the range of 200° C. to 350° C. during the first material gas supplying step, the reducing step, the second material gas supplying step, the nitriding step, the third material gas supplying step, and the silicon supplying step.

8. A method for forming an electrode film by placing an object to be processed in a vacuum atmosphere, forming a barrier film on a surface of the object to be processed, and subsequently forming an electrode film on a surface of the barrier film,
wherein a step of forming the barrier film comprising:
a first material gas supplying step of supplying a first material gas containing a gas of a tungsten compound to the vacuum atmosphere, and subsequently evacuating the first material gas from the vacuum atmosphere,
a reducing step of supplying to the vacuum atmosphere a reducing gas which reduces the tungsten compound and subsequently evacuating the reducing gas from the vacuum atmosphere, wherein the reducing gas contains a gas of a silicon compound, and a tungsten silicide compound is formed on the object by reacting the tungsten compound on the object with the silicon compound of the reducing gas,
a second material gas supplying step of supplying a second material gas containing a gas of a tungsten compound to the vacuum atmosphere, and subsequently evacuating the second material gas from the vacuum atmosphere, wherein the a tungsten is formed on the object by reacting the tungsten silicide compound on the object with the tungsten compound of the second material gas,
a nitriding step of supplying to the vacuum atmosphere a nitriding gas containing nitrogen in its chemical structure and which reacts with the tungsten on the object to generate tungsten nitride, and subsequently evacuating the nitriding gas from the vacuum atmosphere,
a third material gas supplying step of supplying a third material gas containing a gas of a tungsten compound to the vacuum atmosphere, and subsequently evacuating the third material gas from the vacuum atmosphere, and
a silicon supplying step of supplying a silicon-containing gas containing a gas of a silicon compound to the vacuum atmosphere, and subsequently evacuating the silicon-containing gas from the vacuum atmosphere,
wherein a step of forming the electrode film places a conductive layer containing copper as a primary component on the surface of the barrier film.

9. The method for forming an electrode film according to claim 8, wherein
a conductive material containing copper as a primary component is sputtered to place the conductive layer containing copper as a primary component on the surface of the barrier film.

10. The method for forming an electrode film according to claim 8, wherein
the first material gas supplying step uses at least one tungsten compound as the first material gas selected from the group consisting of $WF_6$, WOF and $WOF_4$,
the reducing step uses at least one silane gas as the reducing gas selected from the group consisting of mono-silane gas, disilane gas and dichlorosilane gas, and as a result, the tungsten silicide is produced as the tungsten reduction product,
the second material gas supplying step uses at least one tungsten compound as the second material gas selected from the group of $WF_6$, WOF and $WOF_4$,
the reaction of the tungsten reduction product bond silicon included in the tungsten silicide and fluorine included in the tungsten compound comprising the second material gas and thus formed silane fluoride is desorbed, and
the nitriding step uses at least one nitriding gas selected from the group consisting of ammonia gas, hydrazine gas, hydrazine derivative gas.

11. The method for forming an electrode film according to claim 8, wherein the object is annealed by heating at the temperature higher than 250° C. after forming the electrode film.

12. The method for forming an electrode film according to claim 8, wherein a temperature of the object is maintained in the range of 200° C. to 350° C. during the first material gas supplying step, the reducing step, the second material gas supplying step, the nitriding step, the third material gas supplying step, and the silicon supplying step.

* * * * *